(12) United States Patent
Perner et al.

(10) Patent No.: US 7,330,378 B2
(45) Date of Patent: Feb. 12, 2008

(54) INPUTTING AND OUTPUTTING OPERATING PARAMETERS FOR AN INTEGRATED SEMICONDUCTOR MEMORY DEVICE

(75) Inventors: Martin Perner, München (DE); Thorsten Bucksch, München (DE)

(73) Assignee: Infineon Technologies, AG, Neubiberg (DE)

( * ) Notice: Subject to any disclaimer, the term of this patent is extended or adjusted under 35 U.S.C. 154(b) by 273 days.

(21) Appl. No.: 11/266,477

(22) Filed: Nov. 4, 2005

(65) Prior Publication Data

US 2006/0120139 A1    Jun. 8, 2006

(30) Foreign Application Priority Data

Nov. 4, 2004    (DE) ................ 10 2004 053 316

(51) Int. Cl.
*G11C 7/10* (2006.01)
(52) U.S. Cl. ................ 365/189.01; 365/189.12; 365/240
(58) Field of Classification Search ........ 365/189.01, 365/189.12, 240
See application file for complete search history.

(56) References Cited

U.S. PATENT DOCUMENTS

| 4,394,753 A | 7/1983 | Penzel |
| 5,717,639 A | 2/1998 | Williams et al. |
| 6,278,633 B1 * | 8/2001 | Wong et al. .......... 365/185.03 |
| 2003/0059962 A1 | 3/2003 | Hartmann et al. |

* cited by examiner

*Primary Examiner*—Van Thu Nguyen
*Assistant Examiner*—Nam Nguyen
(74) *Attorney, Agent, or Firm*—Edell, Shapiro & Finnan LLC

(57) ABSTRACT

An integrated semiconductor memory device includes a control circuit with a mode register to store operating parameters, as well as further registers to store further operating parameters. An operating parameter is selectively written to or read from one of the registers for storage of an operating parameter as a function of a first or second state of a configuration signal that is applied to an address connection. Any subsequent write and read access to one of the registers for storage of an operating parameter takes place analogously to a write and read access to a memory cell in a memory cell array. The integrated semiconductor memory device is thus operated to allow writing and reading of operating parameters using a standard interface and a standard protocol for inputting and outputting data to and from the memory cell array.

12 Claims, 5 Drawing Sheets

INPUTTING AND OUTPUTTING OPERATING PARAMETERS FOR AN INTEGRATED SEMICONDUCTOR MEMORY DEVICE

CROSS REFERENCE TO RELATED APPLICATIONS

This application claims priority under 35 USC §119 to German Application No. 10 2004 053 316.4, filed Nov. 4, 2004, and titled "Method for Inputting and Outputting Operating Parameters for an Integrated semiconductor memory device," the entire contents of which are hereby incorporated by reference.

FIELD OF THE INVENTION

The invention relates to a method for inputting and outputting operating parameters for an integrated semiconductor memory device, and to an integrated semiconductor memory device in which operating parameters can be defined for operation of the integrated semiconductor memory device.

BACKGROUND

During the production of integrated semiconductor memories, for example DRAM (dynamic random access memory)—semiconductor memories, operating parameters are defined for operation of the semiconductor memory, and are programmed in the semiconductor memory. The operating parameters include, for example, internal voltage levels which are produced by voltage generators for the semiconductor memory and are fed to an internal voltage network in order to supply further components. Further operating parameters which can be defined include refresh frequencies by which the memory cells are refreshed during normal operation of the semiconductor memory. The operating parameters are in general preset in the semiconductor memory by the programming of fuse elements.

In addition to fuse elements, specific registers for programming of operating parameters are also available on the semiconductor chip. Particularly in the case of integrated semiconductor memories, a so-called mode register is preferably used for this purpose. A mode register set command is applied to the address connections of the semiconductor memory in order to program the mode register. Customary operating parameters, such as a burst length or a CAS latency, are then written to the mode register via the address pins.

The reading of operating parameters that have already been programmed in again can be carried out at any time just by using specific test modes. In this case, test modes are produced at a low frequency on a small number of module pins since a high degree of test parallelism when using slower testers is generally a primary factor in production.

German Patent Document No. DE 101 24 735 C1 describes a method for testing semiconductor chips, in which a check mode is carried out after setting and before carrying out the actual test mode, in which the status of the test mode used in the chip is read in a defined format. Test mode settings can be checked by the application of characteristic bit sequences, and registers which are used for storage of a test result by test modes, can be read. The method according to the invention thus offers the capability to check the state of all of the test modes and registers for a semiconductor chip to be tested, before the actual test is carried out in the chip, so that confidence is obtained that the test has been initiated correctly before the test results are obtained.

Since, in general, test modes are used only within production, the input/output protocol is, however, highly simplified. When a test mode for reading an operating parameter or a test result is activated after the application of a specific bit sequence to the address connections, then the corresponding data can normally be read only by a specific tester, which has previously been appropriately programmed. This is because, in general, the writing and reading of operating parameters is not matched to a standard interface or a standard protocol which is used for writing and reading data during normal operation of the integrated semiconductor memory device.

Operating parameters are therefore not input and output by application of control commands which are used for writing and reading data in accordance with the standard input/output protocol during normal operation of the integrated semiconductor memory device, but by the application of a test mode signal to the address connections. At the moment, it is possible for test purposes to read a large number of the operating parameters via the data connections, but this is not done at the standard operating speed at which the data is also read from the memory cell array. Instead, test data or operating parameters in the case of memory chips which already use a double data rate protocol is or are often still output using the single data rate protocol. Furthermore, the reading of test results or operating parameters is in general also independent of any data validity signal, the so-called data queue strobe signal (DQS signal).

Furthermore, certain registers, such as the mode register, are used only as pure input registers at the moment. External access to the mode register can be gained only via the address connections, although these are not bidirectional connections and therefore cannot also be used for outputting data. The operating parameters stored therein can thus also not be read via a test mode. At the end of the manufacturing process, it must therefore be assumed that the mode register has been correctly programmed.

Since an application generally accesses a memory chip only via the standard input/output interface and via the standard input/output protocol, operating parameters cannot be read at all, or can be read only in a restricted form, at the moment on customer-specific platforms such as the motherboard of a computer. A further disadvantage of the use of test modes for writing and reading operating parameters occurs when using modules. A memory module such as this has memory components which can be addressed in parallel and are shielded from a controller module by the actual computer platform. In the case of a so-called fully buffered DIMM module, the address, command and data pins of the individual memory components on the module can, for example, no longer be addressed directly externally. Instead of this, the individual memory components in the module are accessed via the common controller module. These are in general addressed by a high-frequency bus protocol in order to interchange data with the individual memory components using a standard DRAM protocol. However, since the address connections can be used only to access all the components at the same time, the mode registers of the individual memory components, for example, can be programmed only jointly. The same operating parameters are thus stored in all of the mode registers of the individual memory components. It is thus impossible to set the operating parameters on a component-specific basis.

SUMMARY OF THE INVENTION

An object of the present invention is to provide a method which allows operating parameters which are used for writing and reading data to and from memory cells in the integrated semiconductor memory device to be written and read to and from the integrated semiconductor memory device in a similar manner.

Another object of the present invention is to provide an integrated semiconductor memory device which allows operating parameters which are used for writing and reading data to and from memory cells in the integrated semiconductor memory device to be written to and read from the integrated semiconductor memory device in a similar manner.

The aforesaid objects are achieved individually and/or in combination, and it is not intended that the present invention be construed as requiring two or more of the objects to be combined unless expressly required by the claims attached hereto.

A method for inputting and outputting operating parameters for an integrated semiconductor memory device comprises providing an integrated semiconductor memory device with a data connection to write and read data, a control connection to apply control signals that control a read and write access to the integrated semiconductor memory device, an address connection to apply an address, registers to store operating parameters, and memory cells to store the data. The integrated semiconductor memory device can be switched from a first operating mode to a second operating mode by driving the integrated semiconductor memory device with a configuration signal.

In the first operating mode, control signals are applied to the control connection for a write and read access, during which a data item can be written to and read from one of the memory cells via the data connection, to one of the memory cells.

In the second operating mode, the same control signals are applied to the control connection for a write and read access, in which one of the operating parameters can be written to and read from one of the registers via the same data connection, to one of the registers for storage of one of the operating parameters. The integrated semiconductor memory device is operated in the second operating mode in order to carry out the test method. The integrated semiconductor memory device is driven by the configuration signal in order to operate the integrated semiconductor memory device in the second operating mode.

The integrated semiconductor memory device is selectively either initialized for writing one of the operating parameters to one of the registers for storage of one of the operating parameters, or the integrated semiconductor memory device is initialized for reading one of the operating parameters from one of the registers for storage of one of the operating parameters. Following this, an address is applied to the address connection of the integrated semiconductor memory device for selection of one of the operating parameters and for selection of one of the registers for storage of the selected one of the operating parameters. After this, a first of the control signals, which is used for accessing memory cells along a word line in the first operating mode, is applied to the control connection of the integrated semiconductor memory device for writing and evaluation of the applied address. Either a second of the control signals or a third of the control signals is then selectively applied to the control connection of the integrated semiconductor memory device. The application of the second of the control signals (which is used in the first operating mode for a write access to a memory cell along the word line) to the control connection of the integrated semiconductor memory device and the application of data to the data connection of the integrated semiconductor memory device (which is also used for writing and reading data in the first operating mode) results in the selected one of the operating parameters being written to the selected one of the registers for storage of the selected one of the operating parameters. The application of the third of the control signals (which is used for a read access to a memory cell along the word line in the first operating mode) to the control connection of the integrated semiconductor memory device results in a data record for the selected one of the operating parameters then being produced at the data connection which is also used for writing and reading data in the first operating mode, by reading the selected one of the registers for storage of the selected one of the operating parameters.

The method of the invention makes it possible to set and to read production-specific parameters via a standardized input and output protocol. It is thus possible to access the existing functionality of the semiconductor memory without having to use specific test modes whose input and output protocol offers only restricted access capabilities. Since the standard interface and the standard protocol are continually being developed and improved further, this affects not only the writing and reading of data to and from the memory cell array but also the writing and reading of operating parameters. The writing and reading of operating parameters can thus be matched to the standard operating speed.

The use of the method of the invention also makes it possible to additionally access operating parameters in an application, for example an operating temperature or a refresh frequency. For this purpose, the semiconductor module is switched to the second operating mode, and can be driven by a memory controller using the same control signals which are also used by the memory controller to access memory cells in the first operating mode. Operating parameters can thus be made known to a customer-specific platform. The platform need no longer rely on the selected values but has the capability to request these and, if appropriate, to react to them. The writing and reading of operating parameters is thus no longer the preserve of just test systems.

One embodiment of the method for inputting and outputting operating parameters for the integrated semiconductor memory device provides for the integrated semiconductor memory device to have a mode register for storage of one of the operating parameters. A first state of the configuration signal is applied for operation of the integrated semiconductor memory device in the second operating mode and for writing one of the operating parameters to one of the registers for storage of one of the operating parameters. Following this, at least one bit within the mode register is set to a first state for operation of the integrated semiconductor memory device in the second operating mode and for initialization of the integrated semiconductor memory device for writing one of the operating parameters to one of the registers for storage of one of the operating parameters.

According to a further embodiment of the method for inputting and outputting operating parameters for the integrated semiconductor memory device, the integrated semiconductor memory device is provided with a mode register which is used for storage of one of the operating parameters. A second state of the configuration signal is applied for operation of the integrated semiconductor memory device in the second operating mode and for initialization of the integrated semiconductor memory device for reading one of the operating parameters from one of the registers for storage of one of the operating parameters. Following this, at least one bit within the mode register is set to a second state for operation of the integrated semiconductor memory device in the second operating mode, and for initialization of the integrated semiconductor memory device for reading one of the operating parameters from one of the registers for storage of one of the operating parameters.

Another embodiment of the method for inputting and outputting operating parameters for the integrated semiconductor memory device provides a selected one of the operating parameters by a control circuit after the writing and evaluation of the applied address, when the integrated semiconductor memory device is being operated in the second operating mode and has been initialized for reading one of the operating parameters.

Furthermore, in the method according to the invention, at least one authentication code can be applied to the address connection for operation of the integrated semiconductor memory device in the second operating mode and for authentication of a write or read access to one of the registers for storage of one of the operating parameters.

In accordance with a further embodiment of the invention, an integrated semiconductor memory device which can be operated in a first and a second operating mode, includes at least one address connection for application of addresses, memory cells, at least one register for storage of an operating parameter, at least one data connection for writing and reading data, in which case the data connection can be used to write/read data from/to the memory cells in the first operating mode and can be used to write/read data to/from the register in the second operating mode. Furthermore, the integrated semiconductor memory device includes a control circuit with at least one control connection for application of control signals for controlling a read and write access to the integrated semiconductor memory device.

The control circuit is configured in such a manner that, during operation of the integrated semiconductor memory device in the first operating mode, it evaluates the address applied to the address connection when a first of the control signals is applied, and activates one memory cell, which is associated with that address, from the memory cells for a read and write access. The control circuit is configured in such a manner that, during operation of the integrated semiconductor memory device in the first operating mode, it writes in the data item applied to the data connection to the activated memory cell when a second of the control signals is applied to the control connection. The control circuit is configured in such a manner that, during operation of the integrated semiconductor memory device in the first operating mode, it reads the data item that has been written to the activated memory cell when a third of the control signals is applied to the control connection, and produces this data item at the data connection. Furthermore, the control circuit is configured in such a manner that the integrated semiconductor memory device can be switched from the first operating mode to the second operating mode by driving it with the configuration signal. The control circuit is configured in such a manner that, during operation of the integrated semiconductor memory device in the second operating mode, it evaluates the address that is applied to the address connection when the first of the control signals is applied, and provides the operating parameter selected via that address in the register for storage of an operating parameter, or activates for a write access the register in which the operating parameter selected via that address is stored. The control circuit is configured in such a manner that, during operation of the integrated semiconductor memory device in the second operating mode, it writes a data record, which has been applied to the data connection, of the operating parameter to the register which has been activated for the write access for storage of an operating parameter when the second of the control signals is applied to the control connection. The control circuit is furthermore configured in such a manner that, during operation of the integrated semiconductor memory device in the second operating mode, it reads the operating parameter provided in the register for storage of an operating parameter when the third of the control signals is applied to the control connection, and produces the data record of the operating parameter at the data connection.

The above and still further objects, features and advantages of the present invention will become apparent upon consideration of the following detailed description of specific embodiments thereof, particularly when taken in conjunction with the accompanying drawings where like numerals designate like components.

DETAILED DESCRIPTION

Figure 1:
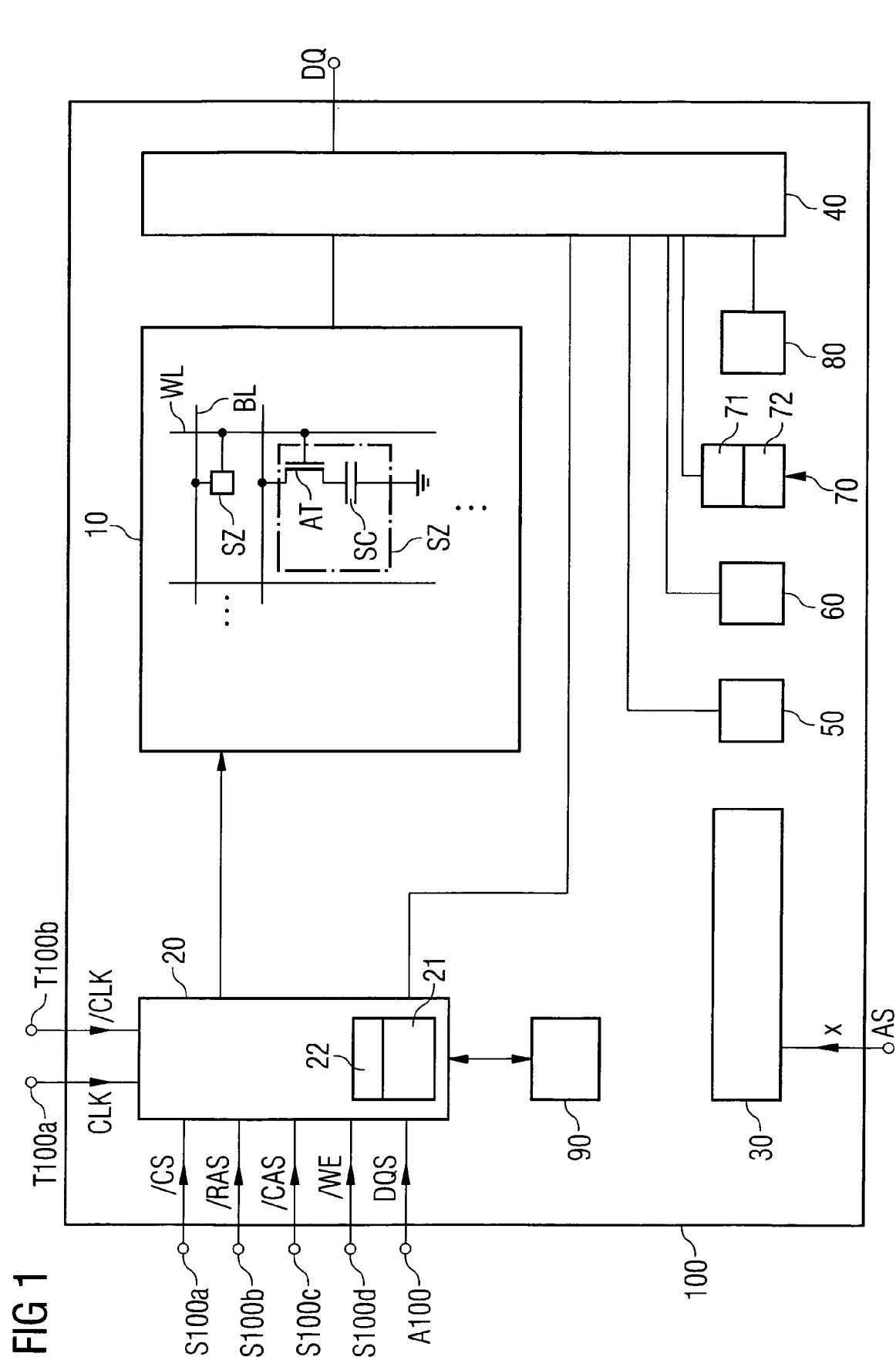
FIG. 1 shows an integrated semiconductor memory device for writing and reading operating parameters according to the invention.

FIG. 1 shows an integrated semiconductor memory device 100 with a memory cell array 10 including memory cells SZ that are arranged along word lines WL and bit lines BL. By way of example, one DRAM memory cell is illustrated in the memory cell array 10, and the DRAM memory cell includes a selection transistor AT and a storage capacitor SC. In order to write and read information to and from the memory cell SZ, the selection transistor AT is switched on by an appropriate signal on the word line WL, which is connected to its control connection. The storage capacitor SC is thus connected with a low impedance to the connected bit line BL. When writing data to the memory cells and when reading data from the memory cells, the data is temporarily stored in a read/write buffer 40, and is passed to the memory cells in the case of a write access, or to the data connection DQ in the case of a read access.

An address register 30 with an address connection A30 is provided for selection of one of the memory cells in the memory cell array for a write or read access. One of the memory cells SZ can be selected for the read or write access via an address X which is applied to the address connection.

The write and read accesses are monitored by a control circuit 20. A mode register 21 and an extended mode register 22 are provided within the control circuit 20. These registers are used in the case of DRAM memories for storage of operating parameters, for example a burst length or a CAS latency time. The control circuit 20 is connected to a control connection S100a for application of a chip selection signal /CS, to a control connection S100b for application of a row selection signal /RAS, to a control connection S100c for application of a column selection signal /CAS and to a control connection S100d for application of an enable signal for a write access /WE.

In addition to the mode register, the integrated semiconductor memory device contains further registers 50, 60, 70 and 80 for storage of further operating parameters. The register 50 is used for storage of a refresh frequency, at which the memory cells in the memory cell array are refreshed. The register 60 is used for storage of the instantaneous operating temperature of the semiconductor memory. The register 70 is in the form of a register for storage of the chip identification number, and has the register elements 71 and 72. By way of example, a batch number of the batch associated with the chip is stored in the register element 71. By way of example, the date of manufacture of the semiconductor memory is stored in the register element 72. The register 80 is used for storage of internal voltage levels which are produced by voltage generators on the semiconductor chip.

Figure 2:
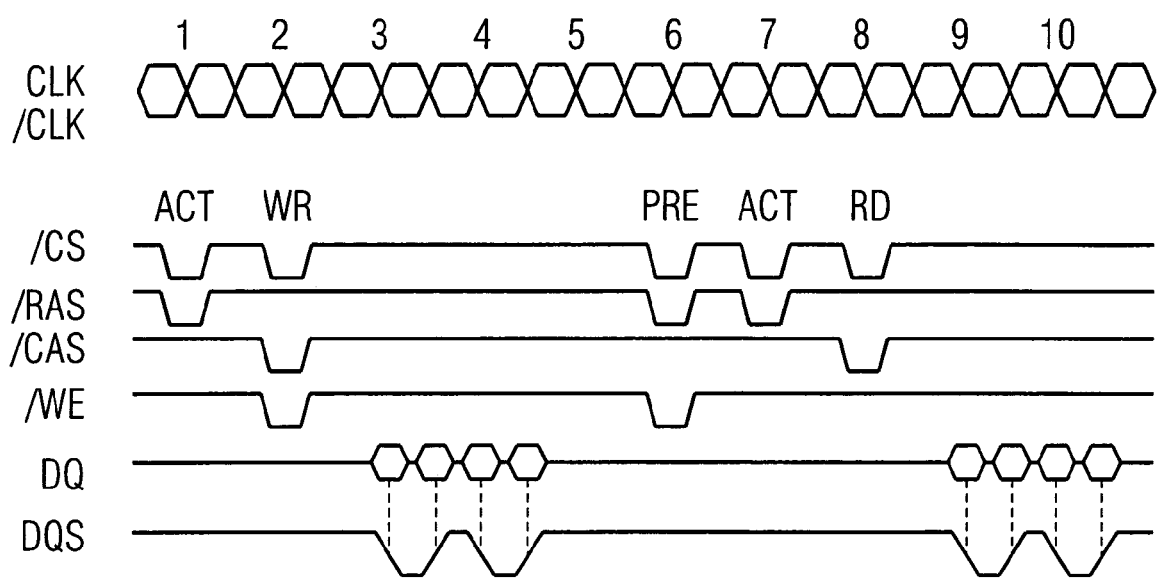
FIG. 2 shows a standard input/output protocol according to the invention.

FIG. 2 shows an example of a standard protocol for writing and reading data from and to memory cells in the memory cell array 10. The integrated semiconductor memory device is operated in synchronism with the profile of two antiphase clock signals CLK and /CLK, which are applied to a clock connection T100a and T100b of the control circuit 20. In order to initiate a write process to the integrated semiconductor memory device, an address signal X is applied to the address connection, and an activation signal ACT is applied to the control connections of the integrated semiconductor memory device, within the clock period 1. The activation signal ACT is in this case composed of a signal combination of the chip selection signal /CS and the row selection signal /RAS. This signal combination at the control connections S100a and S100b of the control circuit 20 results in the control circuit 20 driving a word line, which is connected to that memory cell that has been selected via the address X, in such a manner that the memory cells which are arranged along this word line are activated.

A write signal WR is applied to the control connections of the control circuit 20 in the clock period 2. The write signal WR is formed from a signal combination of the chip selection signal /CS, the row selection signal /CAS and the write signal /WE. The write signal results in a memory cell being selected for writing information to those memory cells which have been activated along one word line. Furthermore, other memory cells are activated as well, as a function of the address X and the organization form of the semiconductor memory.

The data to be written to the activated memory cells is applied to the data connection DQ within the clock periods 3 and 4. The applied data is in this case always applicable to the rising and falling flanks of the data validity signal DQS.

After completion of the writing process, the bit lines for the memory cell array 10 are charged in the clock period 6 to a common precharging voltage within a precharging phase, which is initiated by a control signal PRE at the control connections of the integrated semiconductor memory device. The precharging signal PRE is composed of the signal combination of the chip selection signal /CS, of the row selection signal /RAS and of the enable signal for write access /WE.

When the bit lines have been precharged to the common precharging voltage, a read access can be made to a memory cell in the clock period 7. For this purpose, the control connections of the control circuit 20 are once again driven by the activation signal ACT, and the address connection is driven by the address signal X. As in the clock period 1, the activation signal results in the control circuit 20 driving a word line, which is connected to the memory cell that has been selected via the address X, in such a manner that the memory cells which are arranged along this word line are activated.

A read signal RD is applied to the control connections in the clock period 8. The read signal RD is formed from the signal combination of the chip selection signal /CS and the column selection signal /CAS. The read signal results in only one memory cell from the memory cells which have been activated along one word line being selected for reading an information item. Furthermore, other memory cells are also activated as a function of the address X and the organization form of the semiconductor memory.

The data is read from the activated memory cells and is produced at the data connection DQ within the clock periods 9 and 10. The data at the data connection DQ is in each case valid at the rising and falling clock flanks of the validity signal DQS.

According to the invention, operating parameters for the semiconductor memory are written to the mode register 21 and to the extended mode register 22 as well as to the further registers 50, 60, 70 and 80 by using the same input and output protocol as the protocol described with reference to FIG. 2 for respectively writing and reading data. The write and read accesses to the register are in this case made via the control connections of the control circuit 20 and via the write and read buffer 40, and via the data connection DQ which is connected to it. The standard interface, which is also used for writing and reading data to and from the memory cell array, is thus also used, in addition to the standard protocol. However, in order to ensure that the control signals ACT, WR, RD and PRE are not interpreted by the control circuit 20 for writing and reading data to and from the memory cells in the memory cell array, but as control signals for writing operating parameters to one of the registers for storage of the operating parameters, a configuration signal KS is applied in advance to the control connections of the control circuit 20. The control signal may in this case be formed from a combination of the control signals /CS, /RAS/ /CAS or /WE. The integrated semiconductor memory device can also be designed in such a manner that the configuration signal is applied to the address connections. In this case, the configuration signal represents a sequence of zeros and ones which, of course, must not be the same as a valid address.

The configuration signal KS results in the integrated semiconductor memory device being switched to a second operating mode from a first operating mode in which the control signals ACT, WR, RD and PRE are used for write and read accesses to memory cells in the memory cell array. A write and read access is then made to the registers for storage of the operating parameter, using the same control signals, in the second operating mode.

One state of the configuration signal identifies whether a read or write access is intended to be made to the integrated semiconductor memory device in the second operating mode of the integrated semiconductor memory device. If, by way of example, the configuration signal is formed from the control signals /CS, /RAS, /CAS and /WE, then a first state of the configuration signal results when the chip selection signal /CS is applied to the control connection S100a at a high level, the row selection signal /RAS is applied to the control connection S100b at a high level, the column selection signal /CAS is applied to the control connection S100c at a high level, and the enable signal for the write access /WE is applied to the control connection S100d at a high level. A second state of the configuration signal results when the chip selection signal /CS, the row selection signal /RAS and the column selection signal /CAS are applied to the control connections S100a, S100b and S100c at the high level and the control signal /WE is applied to the control connection S100d at the low level. In the case of the integrated semiconductor memory device according to the invention, there is therefore no need to provide an additional connection for switching between the first and the second operating mode.

When driving the integrated semiconductor memory device with the first state of the configuration signal KS1, the integrated semiconductor memory device is, by way of example, operated in the second operating mode for writing an operating parameter to one of the registers 21, 22, 50, 60, 70 or 80 for storage of an operating parameter. In this case, a signalling bit is set to a first state within the mode register 21.

When driving the integrated semiconductor memory device with the second state of the configuration signal KS2, the integrated semiconductor memory device is, by way of example, operated in the second operating mode for reading an operating parameter from one of the registers 21, 22, 50, 60, 70 or 80 for storage of an operating parameter. In this case, the signalling bit is set to a second state within the mode register 21.

Figure 3A:
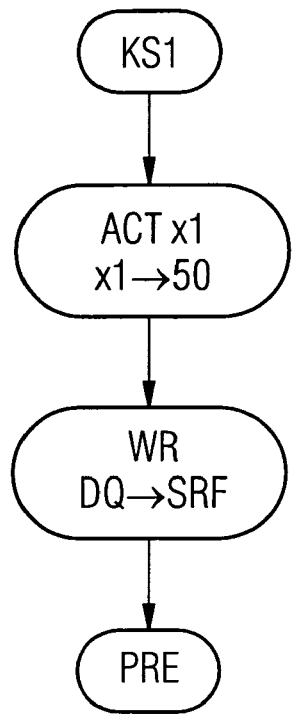
FIG. 3A shows a method for writing a refresh frequency for the integrated semiconductor memory device by a standard input protocol according to the invention.

FIG. 3A shows a method procedure for writing a refresh frequency at which the memory cells in the memory cell array are refreshed. A write access to one of the registers for storage of the operating parameters is indicated to the control circuit 20 by application of a first state of the configuration signal KS1. An address X1 is applied to the address connection A30 in order to activate the process of writing the refresh frequency to the register 50. Once the activation signal ACT has been applied to the control connections of the control circuit 20, the applied address X1 is written and is evaluated. The address X1 represents a characteristic bit sequence which, when the integrated semiconductor memory device is in the second operating mode, is interpreted by the control circuit as a function code for selection of the refresh frequency as the operating parameter.

Following this, a coded bit sequence which corresponds to a value of the refresh frequency to be written is applied to the data connection DQ. When the control circuit 20 is subsequently driven with the write signal WR, then the refresh frequency to be programmed is written to the write and read buffer 40, and from there to the register 50, which is provided for storage of the refresh frequency. The end of the writing sequence is indicated to the control circuit 20 by application of the precharging signal PRE to the control connection.

Figure 3B:
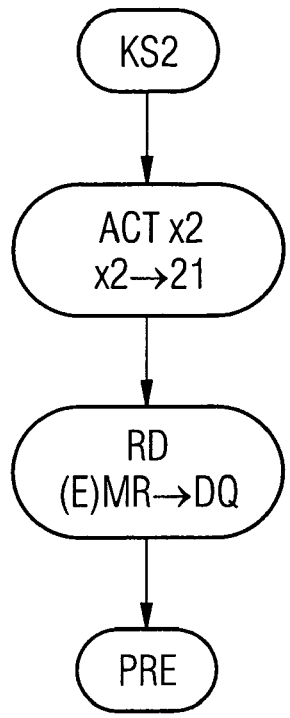
FIG. 3B shows a method for reading a mode register using a standard output protocol according to the invention.

FIG. 3B shows a read access to the mode register 21. In this case, a second state of the configuration signal KS2 is applied to the address connection and indicates to the control circuit 20 that this will be followed by a write access to one of the registers for storage of the operating parameters. The address X2 is then applied to the address connection of the address register 30. The applied function code X2 is written after application of the activation signal ACT, and is evaluated. This indicates to the control circuit 20 that the mode register 21 is being accessed. The read signal RD is applied to the control connections of the control circuit 20 in order to read the mode register 21. The control circuit then writes the contents of the mode register 21 to the write and read buffer 40, from where they are passed on to the data connection DQ. The completion of the read access is indicated to the control circuit 20 by the precharging signal PRE, which is applied to the control connections of the control circuit 20.

Figure 3C:
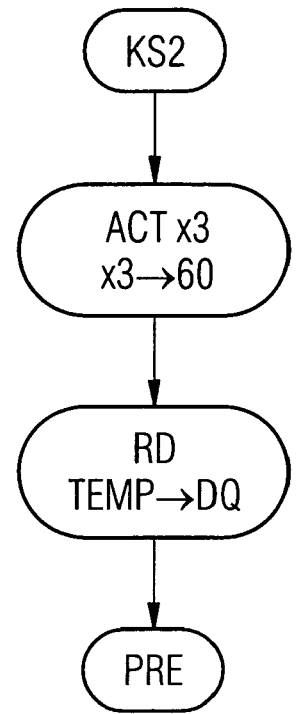
FIG. 3C shows a method for reading an operating temperature of the integrated semiconductor memory device using a standard output protocol according to the invention.

FIG. 3C shows a method procedure for reading an operating temperature of the semiconductor memory, with this temperature being stored in the register 60. The method procedure is analogous to the method procedure described in FIG. 3B. In this case, the address X3 is a characteristic bit sequence which indicates to the control circuit 20 that the operating temperature is being accessed as an operating parameter. Since the integrated semiconductor memory device has been initialized for a read access by the second state of the configuration signal KS2, the application of the activation signal ACT initiates a process for determining the operating temperature, by the control circuit 20 determining the instantaneous operating temperature on the memory chip by checking a temperature sensor 90.

The determined value is then written from the control circuit 20 to the register 60, which is provided for storage of the operating temperature on the semiconductor memory. Once the instantaneous value of the operating temperature has been written to the register 60, the control circuit 20 is driven by the read signal RD. The control circuit 20 then supplies the stored value of the instantaneous operating temperature via the write and read buffer 40 to the data connection DQ. The read access is completed by using the precharging signal PRE to drive the control circuit 20.

Figure 3D:
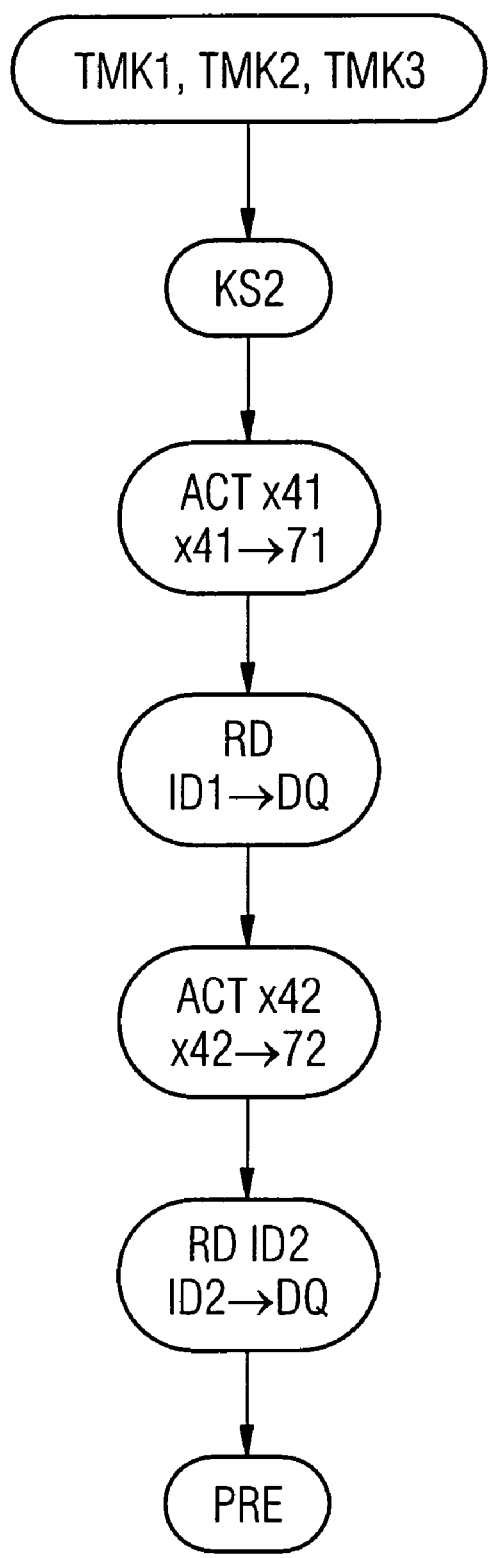
FIG. 3D shows a method for reading a chip identification number for the integrated semiconductor memory device using a standard output protocol according to the invention.

FIG. 3D shows the method procedure for reading a chip identification number which is stored in the register 70 and includes a batch number and a date of manufacture. Since the access to the chip identification number is intended to be protected, the address connection of the address register 30 is driven by a series of authentication signals TMK1, TMK2 and TMK3. The authentication signals are characteristic bit sequences which act as a key by which it is possible to access protected operating parameters.

The application of the second state of the configuration signal KS2 indicates to the control circuit 20 that a read access is being made to an operating parameter. In order to read the chip identification number, the control connections of the control circuit 20 are driven by the activation signal ACT, while an address X41 is applied to the address connection A30 of the address register 30, addressing the batch number of the memory chip as an operating parameter. A subsequent read signal RD at the control connection of the control circuit 20 results in the register element 71 being read, this register element 71 being provided for storage of the batch number, so that the first part of the chip identification number, for example the batch number, is produced at the data connection DQ. In order to read the second register element 72 which, by way of example, contains the date of manufacture of the memory chip, the control connections are once again driven by the activation signal ACT while, in contrast, an address X42, which addresses the date of manufacture as an operating parameter, is now applied to the address connection of the address register. A subsequent read signal RD at the control connections of the control circuit 20 results in a read access to the register element 72, and in the date of manufacture being output at the data connection DQ. The read access to the protected chip identification number is completed by application of the precharging signal PRE to the control connections of the control circuit 20.

Figure 3E:
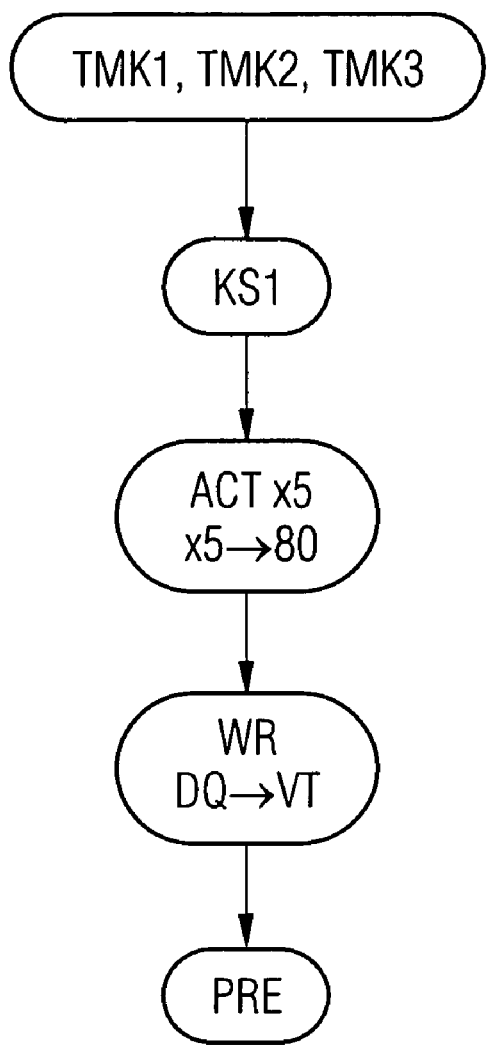
FIG. 3E shows a method for writing an internal voltage level for the integrated semiconductor memory device using a standard input protocol according to the invention.

FIG. 3E shows a protected write access to one of the registers, in the example the register 80 for storage of an internal voltage level. The authentication bit sequence TMK1, TMK2 and TMK3 is applied to the address connection A30 of the address register 30 in order to authenticate this access. The first state of the configuration signal KS1 is then applied to the control connection A30 of the address register 30 in order to configure the integrated semiconductor memory device for a subsequent write access. The control connections of the control circuit 20 are then driven by the activation signal ACT, while address X5, which addresses the internal voltage level VT as an operating parameter to be written, is applied to the address connection A30. When the write signal WR is then applied to the control connections and the bit sequence of the internal voltage level to be selected is applied to the data connection DQ, the internal voltage level is written to the register 80. The write access to the register 80 is completed by driving the control circuit 20 with the precharging signal PRE.

Figure 4:
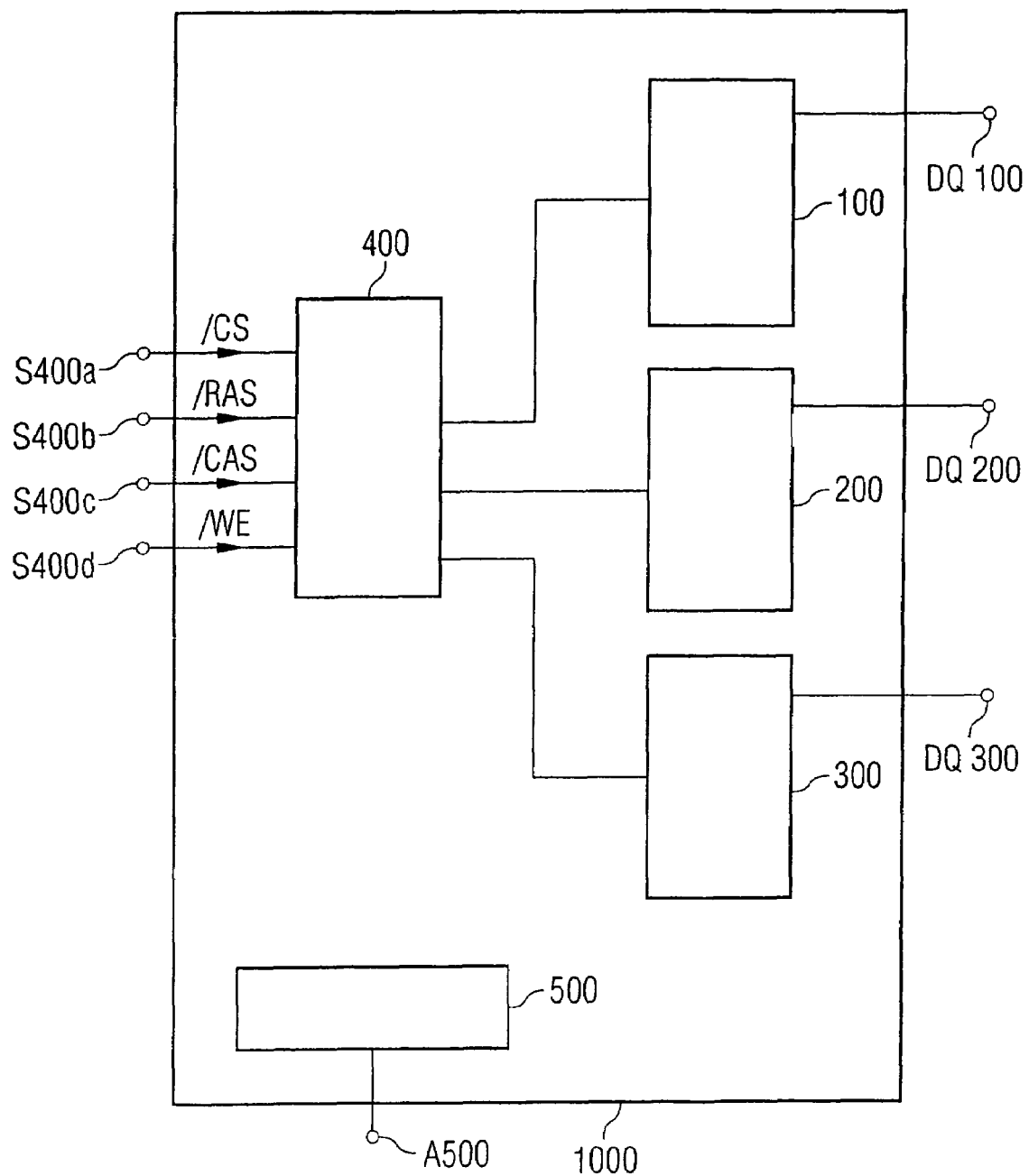
FIG. 4 shows a memory module for writing and reading operating parameters according to the invention.

FIG. 4 shows a memory module 1000 including memory components 100, 200 and 300 which can be addressed in parallel and are driven by a controller module 400. Data connections DQ100, DQ200 and DQ300 are in each case provided on the memory components for writing and reading data to and from the memory cells in the respective memory cell arrays and the registers for storage of the operating parameters, which are provided on each of the memory components. The controller module 400, like the control circuit 20 shown in FIG. 1, is connected to a control connection S400a for application of a chip selection signal /CS, to a control connection S400b for application of a row selection signal /RAS, to a control connection S400c for application of a column selection signal /CAS, and to a control connection S400d for application of an enable signal for a write access /WE. An address register 500, to which an address can be supplied via an address connection A500, is provided on the chip, for selection of a memory cell from the memory components 100, 200 and 300.

The first state of the configuration signal KS1 is applied to the address connection A500 in order to write an operating parameter to one of the memory components. The control circuit 400 is then driven by the activation signal ACT, while the address X, which is used to indicate the operating parameter to be written to the control circuit 400, is applied to the address connection A500. The control connections of the controller module 400 are then driven by the write signal WR. Operating parameters can now be written, on a component-specific basis, to the respective memory component by individual application of an operating parameter to a respective data connection DQ 100, DQ200 and DQ300 of the memory components 100, 200 and 300. If the intention is just to write one parameter to one of the memory components, a default value, by way of example, is applied to the other memory components.

In the same way, corresponding operating parameters can be read from the respective memory components on a component-specific basis. The address connection A500 of the address register 500 is for this purpose driven by a second state of the configuration signal KS2. The activation signal ACT is then applied in conjunction with an address X to the control connections of the controller module 400. In the case of the read access in the second operating mode, the address X represents a function code which defines an operating parameter to be determined. After evaluation of the address, the controller module 400 determines the appropriate operating parameter for each individual one of the memory components in the memory module, and writes these on a component-specific basis to the register intended for this purpose on the respective memory component. The read signal RD which is then applied to the control connections of the controller module 400 results in the corresponding operating parameter for each component being produced at its data connection. The method thus allows a read and write access on a component-specific basis to operating parameters for each individual memory component in the memory module 1000.

In a further embodiment, one of the memory components can be read individually by allowing not only the operating parameter but, for example, also one of the memory components on the module to be selected via the address X for the read access while, in contrast, all of the other memory components are deactivated. The read signal RD which is then applied results in only that memory component which has been activated via the address X producing the selected operating parameter at its data connection. The other memory components produce a default value at their respective data connections.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

10 Memory cell array
20 Control circuit
21 Mode register
22 Extended mode register
30 Address register
40 Write and read buffer
50 Register for storage of the refresh frequency
60 Register for storage of the operating temperature
70 Register for storage of the chip identification number
71, 72 Register element
80 Register for storage of an internal voltage level
100, 200, 300 Memory components
400 Controller module
500 Address register
1000 Memory module
A Address connection
ACT Activation signal
AT Selection transistor
BL Bit line
CLK Clock signal
DQS Validity signal for data
ID Chip identification number
KS Configuration signal
PRE Precharging signal
RD Read signal
S Control connection
SC Storage capacitor
SRF Self-refresh frequency
SZ Memory cell
T Clock connection
TEMP Operating temperature TMK Authentication code
VT Internal voltage level
WL Word line
WR Write signal
/CAS Column selection signal
/CS Chip selection signal
/RAS Row selection signal
/WE Enable signal for a write access

What is claimed is:

1. A method for writing and reading operating parameters for an integrated semiconductor memory device, the method comprising:
   providing an integrated semiconductor memory device including a data connection to write and read data, a control connection to apply control signals for controlling read and write accesses to the integrated semiconductor memory device, an address connection to apply an address, a plurality of registers to store operating parameters, and a plurality of memory cells to store data, wherein the integrated semiconductor memory device is switchable from a first operating mode to a second operating mode by being driven with a configuration signal;
   in the first operating mode, performing a write and read access to one of the memory cells by application of a set of control signals to the control connection, wherein a data item is written to and read from the one of the memory cells via the data connection;
   in a second operating mode, performing a read and write access to one of the registers so as to store one of the operating parameters by applying the set of control signals to the control connection, wherein one of the operating parameters is written to and read from the one of the registers via the data connection;
   driving the integrated semiconductor memory device with the configuration signal in order to operate the integrated semiconductor memory device in the second operating mode;
   selectively performing one of initializing the integrated semiconductor memory device to write one of the operating parameters to one of the registers and initializing the integrated semiconductor memory device to read one of the operating parameters from one of the registers;
   applying an address to the address connection of the integrated semiconductor memory device for selecting one of the operating parameters and for selecting one of the registers for storage of the selected one of the operating parameters;
   applying a first one of the set of control signals that is used in the first operating mode for access to memory cells along a word line to the control connection of the integrated semiconductor memory device to write and evaluate the applied address; and
   selectively performing one of:
      applying a second one of the control signals that is used in the first operating mode for write access to a memory cell along the word line to the control connection of the integrated semiconductor memory device and applying data to the data connection of the integrated semiconductor memory device for writing the selected one of the operating parameters to the selected one of the registers that stores the selected one of the operating parameters; and
      applying of a third one of the control signals that is used in the first operating mode for a read access to a memory cell along the word line to the control connection of the integrated semiconductor memory device and to produce a data record at the data connection for reading the selected one of the operating parameters from the selected one of the registers that stores the selected one of the operating parameters.

2. The method of claim 1, further comprising:
   providing the integrated semiconductor memory device with a mode register that is used to store one of the operating parameters;
   applying a first state of the configuration signal to operate the integrated semiconductor memory device in the second operating mode and to write one of the operating parameters to one of the registers for storage of one of the operating parameters; and
   setting at least one bit within the mode register to a first state for operation of the integrated semiconductor memory device in the second operating mode and for initialization of the integrated semiconductor memory device for writing one of the operating parameters to one of the registers for storage of the one of the operating parameters.

3. The method of claim 1, further comprising:
   providing the integrated semiconductor memory device with a mode register that is used to store one of the operating parameters;
   applying a second state of the configuration signal to operate the integrated semiconductor memory device in the second operating mode and to initialize the integrated semiconductor memory device for reading one of the operating parameters from one of the registers for storage of one of the operating parameters; and
   setting at least one bit within the mode register to a second state for operation of the integrated semiconductor memory device in the second operating mode and for initialization of the integrated semiconductor memory device for reading one of the operating parameters from one of the registers for storage of the one of the operating parameters.

4. The method of claim 1, further comprising:
   providing a selected one of the operating parameters by a control circuit after the writing and evaluation of the applied address and when the integrated semiconductor memory device is being operated in the second operating mode and has been initialized for reading one of the operating parameters.

5. The method of claim 1, further comprising:
   applying at least one authentication code to the address connection for operation of the integrated semiconductor memory device in the second operating mode and for authentication of a write or read access to one of the registers for storage of one of the operating parameters.

6. The method of claim 1, further comprising:
   providing the integrated semiconductor memory device with a register to store a refresh frequency for the integrated semiconductor memory device;
   operating the integrated semiconductor memory device in the second operating mode;
   applying a first address to the address connection for selection of the refresh frequency as an operating parameter and for selection of the register for storage of the refresh frequency; and
   performing one of writing the refresh frequency to the register that stores the refresh frequency and reading of the refresh frequency from the register that stores the refresh frequency.

7. The method of claim 2, further comprising:

operating the integrated semiconductor memory device in the second operating mode;

applying a second address to the address connection for selection of one of the operating parameters and for selection of the mode register for storage of the selected one of the operating parameters; and performing one of writing the selected one of the operating parameters to the mode register and reading of the selected one of the operating parameters from the mode register.

8. The method of claim 1, further comprising:

providing the integrated semiconductor memory device with a register to store an operating temperature for the integrated semiconductor memory device;

operating the integrated semiconductor memory device in the second operating mode;

applying a third address to the address connection for selecting the operating temperature as an operating parameter and for selecting the register for storage of the operating temperature; and performing one of writing the operating temperature to the register for storage of the operating temperature and reading the operating temperature from the register for storage of the operating temperature.

9. The method of claim 5, further comprising:

providing the integrated semiconductor memory device with a register to store an identification code for the integrated semiconductor memory device, the identification code including at least a batch number and a date of manufacture of the integrated semiconductor memory device;

applying the authentication code to the address connection for operation of the integrated semiconductor memory device in the second operating mode and for authentication of a write or read access to the register that stores the identification code, applying a fourth address to the address connection of the integrated semiconductor memory device for selecting the identification code as an operating parameter and for selecting the register for storage of the identification code; and performing one of writing the identification code to the register for storage of the identification code and reading the identification code from the register for storage of the identification code.

10. The method of claim 5, further comprising:

providing the integrated semiconductor memory device with a register to store an internal voltage level for the integrated semiconductor memory device;

applying the authentication code to the address connection for operation of the integrated semiconductor memory device in the second operating mode and for authentication of a write or read access to the register that stores the internal voltage level;

applying a fifth address to the address connection for selecting the internal voltage level as an operating parameter and for selecting the register that stores the internal voltage level; and performing one of writing the internal voltage level to the register for storing the internal voltage level and reading the internal voltage level from the register that stores the internal voltage level.

11. An integrated semiconductor memory device that is operable in a first operating mode and a second operating mode, the semiconductor memory device comprising:

an address connection to apply addresses;

a plurality of memory cells;

a register to store an operating parameter;

a data connection to write and read data, wherein the data connection is operable in the first operating mode for writing/reading data to/from the memory cells, and the data connection is further operable in the second operating mode for writing/reading data to/from the register;

a control circuit including at least one control connection to apply control signals for controlling a read and write access to the integrated semiconductor memory device;

wherein:

the control circuit is configured such that, during operation of the integrated semiconductor memory device in the first operating mode, the control circuit evaluates an address applied to the address connection when a first control signal is applied, and the control circuit activates one memory cell that is associated with the address from the memory cells for a read and write access;

the control circuit is further configured such that, during operation of the integrated semiconductor memory device in the first operating mode, the control circuit writes a data item applied to the data connection to the activated memory cell when a second one of the control signals is applied to the control connection;

the control circuit is further configured such that, during operation of the integrated semiconductor memory device in the first operating mode, the control circuit reads the data item that has been written to the activated memory cell when a third one of the control signals is applied to the control connection, and the control circuit produces the data item at the data connection;

the control circuit is further configured to switch the integrated semiconductor memory device from the first operating mode to the second operating mode by driving the integrated semiconductor memory device with a configuration signal;

the control circuit is further configured such that, during operation of the integrated semiconductor memory device in the second operating mode, the control circuit evaluates the address that is applied to the address connection when the first of the control signals is applied, and the control circuit performs one of providing the operating parameter selected via the address in the register for storage of an operating parameter and activating for a write access the register in which the operating parameter selected via that address is stored;

the control circuit is further configured such that, during operation of the integrated semiconductor memory device in the second operating mode, the control circuit writes a data record that has been applied to the data connection of the operating parameter to the register which has been activated for the write access for storage of an operating parameter when the second of the control signals is applied to the control connection; and the control circuit is further configured such that, during operation of the integrated semiconductor memory device in the second operating mode, the control circuit reads the operating parameter provided in the register for storage of an operating parameter when the third of the control signals is applied to the control connection, and the control circuit produces the data record of the operating parameter at the data connection.

12. The integrated semiconductor memory device of claim 11, wherein the register for storage of one of the operating parameters comprises a mode register.

* * * * *